(12) United States Patent
Gutierrez et al.

(10) Patent No.: US 10,145,890 B2
(45) Date of Patent: Dec. 4, 2018

(54) TESTING ELECTRONIC DEVICES

(71) Applicant: Hewlett Packard Enterprise Development LP, Houston, TX (US)

(72) Inventors: Diego Gutierrez, Houston, TX (US); Robin T. Lovelace, Houston, TX (US); Terry W. Denney, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 81 days.

(21) Appl. No.: 15/127,271

(22) PCT Filed: Mar. 28, 2014

(86) PCT No.: PCT/US2014/032156
§ 371 (c)(1),
(2) Date: Sep. 19, 2016

(87) PCT Pub. No.: WO2015/147861
PCT Pub. Date: Oct. 1, 2015

(65) Prior Publication Data
US 2017/0108546 A1    Apr. 20, 2017

(51) Int. Cl.
*G01R 31/10* (2006.01)
*G01R 31/28* (2006.01)
(Continued)

(52) U.S. Cl.
CPC ...  *G01R 31/2855* (2013.01); *G01R 31/31701* (2013.01); *G01R 31/31724* (2013.01); *G01R 31/31937* (2013.01)

(58) Field of Classification Search
CPC .... G06F 3/0619; G06F 3/0689; G06F 3/0688; G06F 21/6218; G06F 3/064; G06F 3/0659; G06F 3/061; G06F 3/067; G06F 17/30091; G06F 11/1471; G06F 11/1076; G06F 11/2094; G06F 3/0685; G06F 3/121; G06F 11/006; G06F 11/0751; G06F 11/0784; G06F 11/0787; G06F 11/0793;
(Continued)

(56) References Cited

U.S. PATENT DOCUMENTS 6,057,698 A  *  5/2000  Heo, II ......... G01R 31/318505
                                          324/750.03
6,329,831 B1    12/2001  Bui et al.
(Continued)

FOREIGN PATENT DOCUMENTS

JP        2009121844 A      6/2009

OTHER PUBLICATIONS

Butler, L. et al.; "PXI Based RF Record/Playback System"; NTS Engineering Services, May 12, 2009; 3 pages.
(Continued)

*Primary Examiner* — Vinh Nguyen
(74) *Attorney, Agent, or Firm* — Nolte Intellectual Property Law Group

(57) ABSTRACT

A controller is switched from a first mode to a second mode, where the controller in the first mode is to manage a plurality of electronic devices collectively as a logical unit. The controller in the second mode is used to individually test the plurality of electronic devices, where the controller in the second mode allowing sending of a test command individually to a respective one of the plurality of electronic devices.

15 Claims, 3 Drawing Sheets

(51) Int. Cl.
*G01R 31/317* (2006.01)
*G01R 31/3193* (2006.01)

(58) Field of Classification Search
CPC ............ G06F 13/4022; G06F 2201/80; G06F 2212/202; G06F 2212/2022; G06F 3/0607; G06F 3/0653; H04L 41/0677; G01R 31/2855
See application file for complete search history.

(56) References Cited

U.S. PATENT DOCUMENTS

| | | | |
|---|---|---|---|
| 6,750,646 | B1 | 6/2004 | Voss et al. |
| 8,482,915 | B2 | 7/2013 | Merrow |
| 2004/0239359 | A1 | 12/2004 | Matsumoto |
| 2004/0255216 | A1 | 12/2004 | Ichiyoshi |
| 2006/0036907 | A1 | 2/2006 | Inscoe et al. |
| 2012/0120524 | A1 | 5/2012 | Farquhar et al. |
| 2013/0060502 | A1 | 3/2013 | Dang et al. |
| 2013/0124932 | A1 | 5/2013 | Schuh et al. |
| 2013/0159814 | A1* | 6/2013 | Hashimoto ............ G11C 29/04 714/773 |
| 2013/0191592 | A1* | 7/2013 | Li ........................... G06F 12/08 711/114 |
| 2013/0311745 | A1* | 11/2013 | Harris ................... G06F 3/0611 711/171 |

OTHER PUBLICATIONS

Feliss, B. et al. Environmental and Vibration Testing of Hard Disk Drives for Automotive Applications. Hitachi Global Storage Technologies, Inc. San Jose, CA, Retrieved on Sep. 14, 2016 6 pages.
International Searching Authority, "Notification of Transmittal of the International Search Report and the Written Opinion", PCT/US2014/032156; dated Dec. 22, 2014 14 pps.
Tran, D. et al. "Mobile Environment Chamber", Portland State University, Maseeh College of Engineering & Computer Science, Progress Report Winter 2010, Mar. 7, 2011 22 pages.

* cited by examiner

TESTING ELECTRONIC DEVICES

BACKGROUND

A vendor of electronic devices can perform tests of such electronic devices prior to shipping the electronic devices to customers. Testing of electronic devices is performed in an effort to identify defects or other issues of the electronic devices. In some cases, testing performed by vendors may be inadequate, which can result in electronic devices with defects or other issues being shipped to customers.

BRIEF DESCRIPTION OF THE DRAWINGS

Some implementations are described with respect to the following figures.

DETAILED DESCRIPTION

Figure 1:
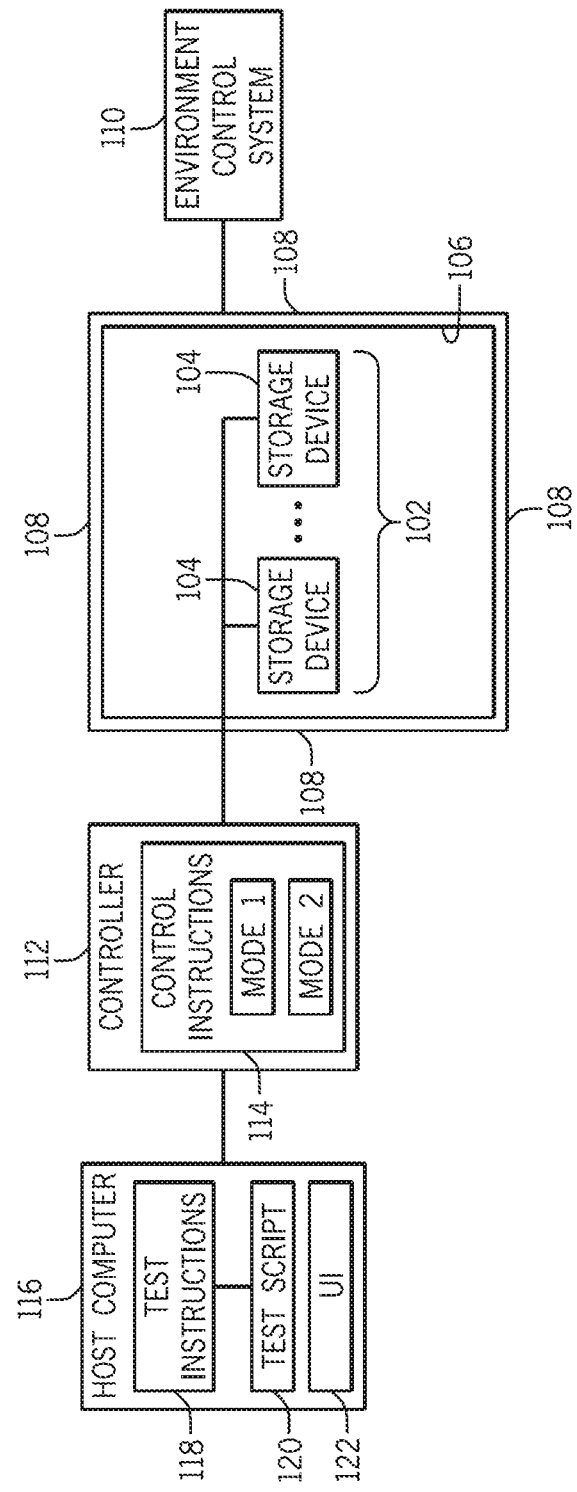
FIG. 1 is a block diagram of an example arrangement for testing electronic devices, in accordance with some implementations.

A vendor of electronic devices can refer to any entity (e.g. a business concern, an educational organization, a government agency, an individual, etc.) that makes, sells, and/or supplies electronic devices to a customer. Examples of electronic devices can include storage devices, such as disk-based storage devices, solid state storage devices, memory devices, tape-based storage devices, and so forth. Other examples of electronic devices include computing devices, communication devices and so forth.

Testing of electronic devices by a vendor may be performed in test environments that do not adequately represent the environment in which the electronic devices are to be deployed. For example, a test environment can include test equipment used for interacting with the electronic devices, where the test equipment can differ from equipment used in an operational environment of a customer of the vendor. Also, an environmental condition (e.g. temperature, humidity, pressure, etc.) of the test environment may be different from the environmental condition associated with the operational environment. As a result, testing of electronic devices may result in defects, faults, or other issues of electronic devices being missed. If electronic devices with defects, faults, or other issues are shipped to customers, customers may experience operational failures, which may lead to customer dissatisfaction. Also, if such electronic devices are covered by warranty, substantial warranty costs associated with repairing or replacing the electronic devices may be incurred by the vendor.

In accordance with some implementations, a testing arrangement is provided that allows electronic devices to be tested in a test environment that more closely resembles an actual operational environment (as would be provided by a customer of a vendor of the electronic devices). In implementations where electronic devices are deployed as a group (e.g. an array of storage devices, a cluster of computing devices or communication devices, etc.), it may be difficult to individually test the electronic devices in the group. To allow for individual testing of electronic devices in the group, a controller that manages the electronic devices can be switched between different modes, including a first mode and a second mode. In the first mode, the controller manages the group of electronic devices as a logical unit. The first mode is the mode used during normal operation of the group of electronic devices, as would be performed by a customer. A logical unit of electronic devices can refer to a unit that is seen by a higher-level entity (e.g. an application, an operating system, etc.) of a system. Thus, even though there are physically multiple electronic devices in the group, the higher-level entity treats these multiple physical electronic devices as a unit when accessing or interacting with the group of electronic devices. For example, if the group of electronic devices includes a group of storage devices, then the group of storage devices can be read from or written to as a logical unit by the higher-level entity.

In the first mode, the controller is able to allow a test tool to test the logical unit made up of the group of storage devices. In the second mode, the controller is able to allow the test tool to individually test the electronic devices. Thus, instead of the electronic devices being treated as a logical unit as would be the case for normal operation, the controller in the second mode allows for individual access of the electronic devices for testing.

In the ensuing discussion, reference is made to testing of storage devices. However, it is noted that techniques or mechanisms according to some implementations can be applied to other types of electronic devices.

FIG. 1 is a block diagram of an example test arrangement for testing a group 102 of storage devices 104. The group 102 of storage devices can also be referred to as an array 102 of storage devices.

The storage devices 104 can be provided within a test chamber 106 defined within walls 108. The test chamber 106 can be in a room of a building or in any other test structure. An environment control system 110 is able to control at least one environmental condition in the test chamber 106. Examples of environmental conditions of the test chamber 106 that can be controlled include any or some combination of the following: temperature in the test chamber 106, pressure in the test chamber 106, humidity inside the test chamber 106, and so forth.

The array 102 of storage devices is managed by a controller 112, which can also be referred to as an array controller 112, In examples where the storage devices 104 are arranged in a Redundant Array of Independent Disks (RAID) array, the controller 112 can be a RAID controller. A RAID array of storage devices stores error protection information to allow for detection and correction of errors in data stored by the storage devices 104. In some examples, the data protection information can include a mirrored copy of the data. In other examples, the data protection information can include parity information.

In other examples, other arrangements of the storage devices 104 can be provided.

Although not shown in FIG. 1, the storage devices 104 can be connected to an interconnect circuit (e.g. an expander, a network interface controller, etc.) to allow the storage devices 104 to communicate with the controller 112.

Also, although the controller 112 is depicted as being outside the test chamber 106, it is noted that the controller 112 can be provided inside the test chamber 106 in other examples.

The controller 112 includes control instructions 114, which can include machine-readable instructions executable by a processing circuit in the controller 112. The control instructions 114 can be in the form of firmware or software.

The control instructions 114 can be set into one of multiple modes, including mode 1 and mode 2 shown in FIG. 1. As noted above, in mode 1, the group 102 of storage devices is treated as a logical unit. A host computer, such as host computer 116, is able to send an access command to the controller 112 for accessing a logical storage (made up of the array 102 of storage devices). The access command can be a read command, a write command, or another type of command that involves access of data stored by the logical storage unit.

In mode 2, the host computer 116 is able to send individual commands through the controller 112 to the respective storage devices 104, for individual access of the storage devices 104.

In the example test arrangement of FIG. 1, the host computer 116 includes test instructions 118 that are executable to perform testing of the storage devices 104. Note that it is possible to test the storage devices 104 as a logical unit (when the controller 112 is set to mode 1) or to test the storage devices 104 individually (when the controller 112 is set to mode 2). The test instructions 118 are able to use the controller 112 to gain access to a status of an individual storage device 104, to manipulate command parameters, and to interact with the underlying hardware to perform a test.

The host computer 116 further includes a test script 120. The test script 120 is a data structure (e.g. file, object, etc.) that includes parameters set to specific values to be used during testing of the storage devices 104. The parameters can include parameters relating to characteristics of the storage devices 104, such as a block size, a block count, a dwell time, a logical block address range, task management functions, error limit, and so forth.

In implementations where data is arranged as blocks in a storage device(s) 104, a block size specifies a size of each block, and a block count indicates a number of blocks of data stored by the storage device(s) 104 to be operated on by a respective test command, A dwell time can refer to a period of time during which a storage device under test is not being accessed (i.e. no test command is issued to the storage device under test). A logical block address range can specify a range of addresses that is to be the focus of testing.

Task management functions can refer to specified functions that are performed. An error limit can specify a number of acceptable error incidents in a test operation. For example, a test can continue even if a failure condition is encountered, since it may be desirable to understand if the failure condition creates a permanent reliability issue. Flexibility is provided to ignore errors that would normally create a failure condition during normal operation.

Also, the test script 120 can include a test data pattern and test sequence to be used for writing to a storage device 104.

Examples of test sequences that can be performed based on information included in the test script 120 can include any of the following:
- writing an aggressive data pattern (a data pattern containing many changes in data) to the full capacity of a storage device 104 using a variable or specific transfer size (size of data written to the storage device with one command);
- reading an aggressive data pattern from the storage device 104;
- placing a storage device 104 into a low power mode and then activating a read/write head (that includes a read element or write element in an example where the storage device 104 is a disk-based storage device);
- writing a data pattern to a storage device 104, followed by reading back the written data pattern, and followed by comparing the written data pattern with the read data pattern;
- writing a data pattern to a storage device 104 or reading a data pattern from a storage device 104 that is designed to cause signals used in the writing or writing to be close to or to violate signal integrity specifications relating to timings or other characteristics of signals used to access the storage device;
- resetting a storage device 104 (which causes the storage device 104 to transition through a power cycle); or
- any other test sequence.

In some implementations, a test sequence can be designed to place an increased workload on a storage device under test. The increased workload can challenge an internal data path of the storage device, or an interface of the storage device used for communications with the controller 112. Such increased workload is designed to determine if anomalous behavior, faults, or failures would result, which can be indicative of short-term or long-term reliability issues.

The test instructions 118 can include first code for issuing test commands to the storage devices 104. The test commands can conform with industry standards, such as the commands of an Advanced Technology Attachments (ATA)/ ATA Programming Interface (ATAPI) command set, Small Computer System Interface (SCSI) block commands, SCSI primary commands, and so forth. Alternatively, the test commands can be proprietary commands that are specific to a vendor of the storage devices 104. The test commands can be low-level commands that can be communicated through a physical interface of a storage device 104. This physical interface can be an SAS (Serial attached SCSI) interface, an SATA (serial ATA) interface, or other physical interface. A low-level command can be a command that can be handled or processed by the respective physical interface. The test instructions 118 can document error conditions, command timing, and throughput performance relating to reads and writes of a storage device and of the storage devices 104 as a group. The test instructions 118 can also record parametric data of the storage device 104.

The test instructions 118 can access the controller 112 to obtain information relating to a status of a storage device 104 (e.g. whether the storage device 104 is active or inactive). Also, the test instructions 118 are able to vary parameters in test commands issued to the controller 112, where the parameters can include any of the ones noted above. Values of the parameters can be varied to be outside of normal operating ranges, as would be used during normal operation of the storage devices 104.

The test instructions 118 can also include second code for gathering information based on responses from storage devices 104 under test. The gathered information can include information relating to recoverable or unrecoverable errors detected during a test, information relating to an access speed of a storage device, information relating to a communication speed with an interface of the storage device, information relating to a status of the storage device, and so forth. Note that the gathered information can also include values of parameters used in test commands, as well as data patterns used in the tests. The gathered information can be stored in a data log, which can be later analyzed.

The test instructions 118 are also able to receive environment information relating to an expected operational environment where the storage devices 104 are to be actually deployed by a customer. The environment information can be provided by the customer, or can be derived based on discussions with the customer. The environment information can include temperature information, humidity information, pressure information, or information pertaining to other environmental conditions. Using such environment information, the test instructions 118 can control the environment control system 110 to adjust the appropriate environmental condition(s) within the test chamber 106 during testing of the storage devices 104, In this manner, a customer operational environment can be simulated in the test chamber 106.

The host computer 116 can also include a user interface (UI) 122, which allows for user interaction with the test instructions 118 in the host computer 116. For example, through the UI 122, a user can selectively set the controller 112 into mode 1 or mode 2. Also, results of a test can be displayed in the UI 122. The UI 122 can include a display device as well as a user input device (e.g. touch screen, mouse device, keyboard, etc.).

Figure 2:
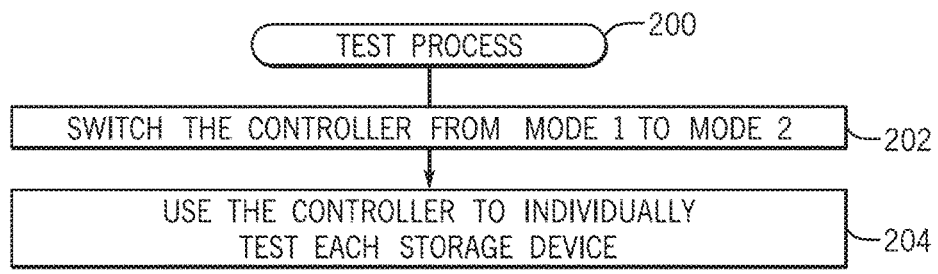
FIG. 2 is a flow diagram of an example test process according to some implementations.

FIG. 2 is flow diagram of a test process 200 according to some implementations. The test process 200 can be performed by the test instructions 118 executable in the host computer 116, for example. The test process 200 switches (at 202) the controller 112 from mode 1 to mode 2. The switching of the controller 112 can be accomplished by issuing a mode-switch command by the test instructions 118 to the controller 112, to cause the controller 112 to switch from mode 1 to mode 2. The issuing of the mode-switch command can be in response to a user input at the UI 122, or alternatively, the issuing of the mode-switch command can be performed automatically by the test instructions 118.

Once the controller has been switched to mode 2, the test process 200 uses (at 204) the controller in mode 2 to individually test the storage devices 104. To individually test each storage device 104, the test instructions 118 can send a test command individually to each respective one of the storage devices 104.

In response to test commands sent to an individual storage device 104, information relating to a behavior or condition of the individual storage device 104. As noted above, gathered information can include information relating to recoverable or unrecoverable errors detected during a test, information relating to an access speed of a storage device, information relating to a communication speed with an interface of the storage device, information relating to a status of the storage device, and so forth. Note that the gathered information can also include values of parameters used in test commands, as well as data patterns used in the tests.

In some examples, mode 2 of the controller 112 can be a host bus adapter (HBA) mode. An HBA connects a host system (e.g. host computer 116) to another device, such as a storage device 104. In the HBA mode, the controller 112 behaves as an HBA to allow for individual connection of the host computer 116 to a respective storage device 104.

In some examples, during a test, a test command is generated at an application level (at the level of the test instructions 118). This test command is provided to a firmware level (including control instructions 114). The instructions at the firmware level can in turn perform a test at a physical device (e.g. a storage device 104). A response to a test is propagated in the opposite direction, from the physical device to the firmware level, and from the firmware level to the application level.

Although the foregoing refers to individually testing a storage device 104 while the controller 112 is in mode 2, it is noted that the array 102 of storage devices can also be tested collectively as a logical storage unit when the controller 112 is in mode1.

Figure 3:
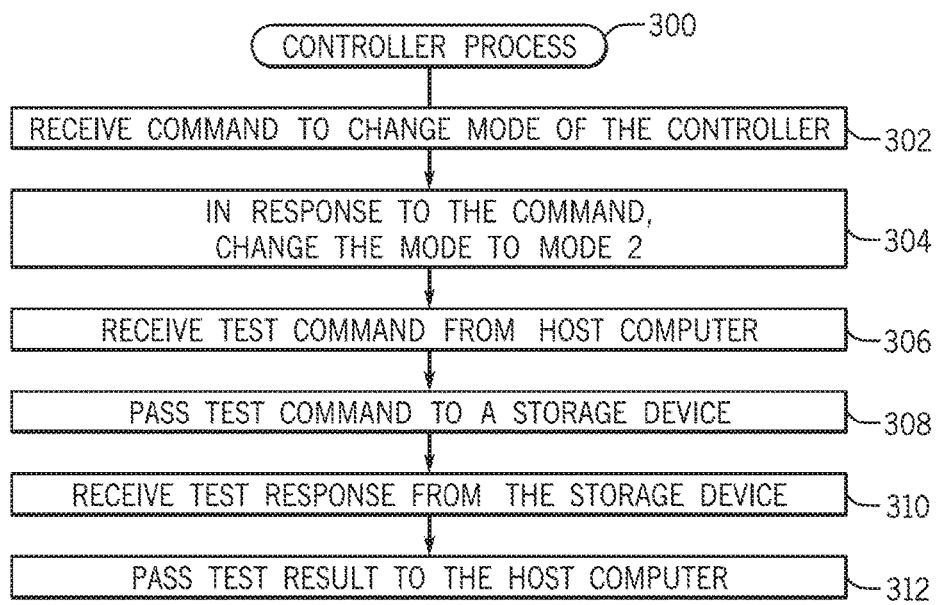
FIG. 3 is a flow diagram of an example process of an example controller, according to some implementations.

FIG. 3 is a flow diagram of a process 300 of the controller 112 according to further implementations. The controller 112 receives (at 302) a command to change a mode of the controller 112, such as from mode 1 to mode 2. In response to the command, the controller 112 changes (at 304) its mode of operation to mode 2.

In mode 2, the controller 112 receives (at 306) a test command (which targets an individual storage device 104) from the host computer 116. The controller 112 passes (at 308) the test command to the target storage device 104, to perform individual testing of the target storage device 104.

In response to the test command, the controller 112 receives (at 310) a test response from the storage device 104. The controller 112 passes (at 312) the test response to the host computer 116, for logging at the host computer 116.

Figure 4:
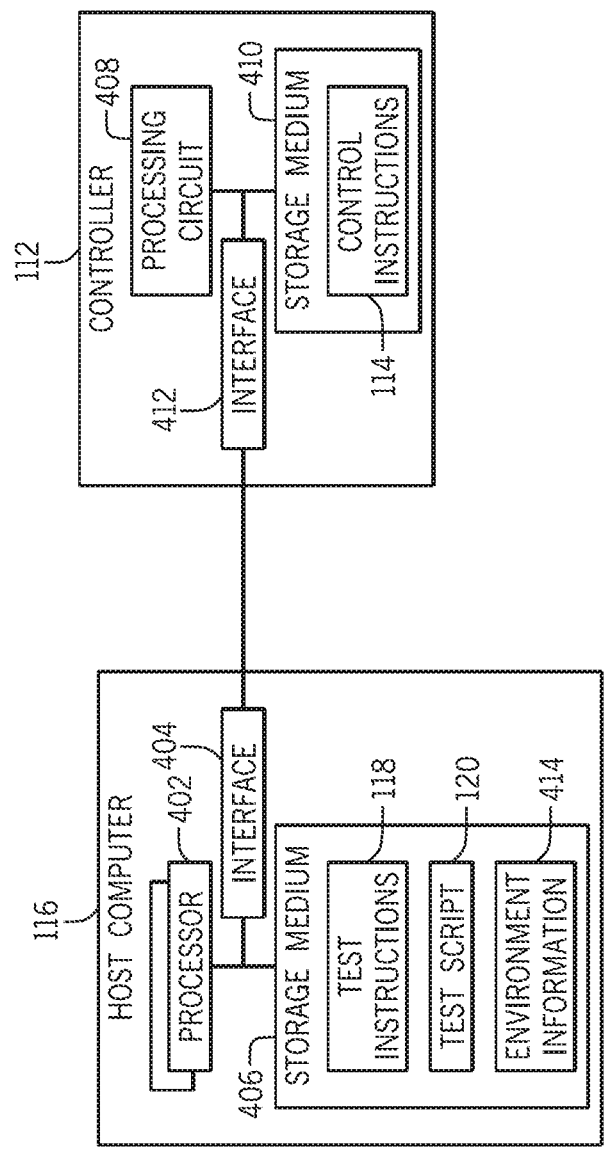
FIG. 4 is a block diagram of an example arrangement including a host computer and a controller, according to some implementations.

FIG. 4 is a block diagram of an example arrangement that includes the host computer 116 and the controller 112, according to some implementations. The host computer 116 includes one or multiple processors 402, which can be coupled to an interface 404 (for allowing the host computer 116 to communicate with the controller 112) and a storage medium (or storage media) 406, which can store the test instructions 118 and the test script 120. A processor can include a microprocessor, microcontroller, processor module or subsystem, programmable integrated circuit, programmable gate array, or another control or computing device. The storage medium (or storage media) 406 can also store environment information 414 that is used to adjust environmental condition(s) of the test chamber 106 (FIG. 1).

The controller 112 includes a processing circuit 408, which is coupled to a storage medium (or storage media) 410, which can store the control instructions 114. The processing circuit 408 can include a microcontroller, an ASIC, a PGA, and so forth. Although the storage medium 410 is shown as being separate from the processing circuit 408, note that the storage medium 410 can alternatively be part of the processing circuit 408. The controller 112 also includes an interface 412 that allows the controller 112 to communicate with the host computer 116.

The storage media 406 and 410 are non-transitory computer-readable or machine-readable storage media. The storage media can include different forms of memory including semiconductor memory devices such as dynamic or static random access memories (DRAMs or SRAMs), erasable and programmable read-only memories (EPROMs), electrically erasable and programmable read-only memories (EEPROMs) and flash memories (e.g. NAND flash memories); magnetic disks such as fixed, floppy and removable disks; other magnetic media including tape; optical media such as compact disks (CDs) or digital video disks (DVDs); or other types of storage devices (e.g. solid state storage media). Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A method comprising:
switching, by a computer, a controller from a first mode to a second mode, wherein the controller is communicatively coupled to a plurality of electronic devices, and the controller in the first mode allows sending of a first test command generated by the computer to the plurality of electronic devices to test the plurality of electronic devices collectively as a logical unit; and
using the controller in the second mode to individually test the plurality of electronic devices, the controller in the second mode allowing sending of a second test command individually to a respective one of the plurality of electronic devices, the second test command generated by the computer.

2. The method of claim 1, wherein switching the controller from the first mode to the second mode comprises changing a setting of machine-readable instructions executing on the controller.

3. The method of claim 1, further comprising switching, by the computer, the controller from the second mode to the first mode to cause the controller to test the plurality of electronic devices collectively as a logical unit.

4. The method of claim 1, wherein switching the controller from the first mode to the second mode is performed as part of a testing procedure performed by a vendor prior to shipment of the plurality of electronic devices to a customer of the vendor.

5. The method of claim 1, wherein the plurality of electronic devices are provided in an environmentally controlled chamber, the method further comprising:
adjusting at least one environment condition of the environmentally controlled chamber during testing of the plurality of electronic devices.

6. The method of claim 1, further comprising:
receiving, by the computer from the controller, information relating to a response of the one of the plurality of electronic devices to the second test command; and
logging, by the computer, the received information in a log, the received information including information pertaining to data errors, information relating to a speed associated with the one of the plurality of electronic devices, and information relating to a status of the one of the plurality of electronic devices.

7. The method of claim 1, wherein the plurality of electronic devices include storage devices.

8. The method of claim 1, wherein individual testing of one of the plurality of electronic devices includes varying parameters relating to the individual testing, and varying a data pattern of the individual testing.

9. The method of claim 8, wherein varying the parameters comprises varying at least one of a data block size and a data block count.

10. The method of claim 8, wherein varying the parameters comprises varying a time parameter specifying a period of time during which no command is to be issued to the one of the plurality of electronic devices during an individual test.

11. A controller comprising:
a processing circuit responsive to a command from a computer to selectively set the controller in a first mode and a second mode,
wherein, in the first mode, the processing circuit is to test a plurality of electronic devices collectively as a logical unit by passing a first test command from the computer to the plurality of electronic devices, the processing circuit communicatively coupled to the plurality of electronic devices, and
wherein, in the second mode, the processing circuit is to individually test the plurality of electronic devices by passing a second test command from the computer to an individual one of the plurality of electronic devices.

12. The controller of claim 11, wherein in the second mode the controller is to operate as a host bus adapter.

13. The controller of claim 11, wherein in the first mode the controller is to operate as a RAID controller.

14. The controller of claim 11, further comprising instructions executable on the processing circuit, the instructions including firmware, wherein the second test command is from an application in the computer, and the firmware is to interact with the individual one of the plurality of electronic devices, and wherein a response to the second test command is provided from the individual one of the plurality of electronic devices through the firmware to the application.

15. A system comprising:
an environmentally controlled chamber containing a plurality of storage devices;
a controller coupled to the plurality of storage devices; and
a computer to control at least one environmental condition of the environmentally controlled chamber and to:
set the controller in a first mode, wherein the controller in the first mode allows access to the plurality of storage devices collectively as a logical unit;
send a first test command to test the plurality of storage devices collectively as the logical unit while the controller is in the first mode;
switch the controller from the first mode to a second mode, wherein in the second mode the controller allows individual access by the system of an individual one of the plurality of storage devices; and
send a second test command individually to the individual one of the plurality of storage devices while the controller is in the second mode.

* * * * *